United States Patent
Fujita et al.

(10) Patent No.: US 11,106,067 B2
(45) Date of Patent: Aug. 31, 2021

(54) DISPLAY DEVICE WITH ADHESIVE FRAME AND CORNER ADHESIVE CONNECTION MEMBER

(71) Applicant: Sony Corporation, Tokyo (JP)

(72) Inventors: Kiyohito Fujita, Tokyo (JP); Takuya Inaba, Tokyo (JP); Takashi Arai, Tokyo (JP); Hiroshi Kubo, Tokyo (JP); Yasuhiro Kageyama, Tokyo (JP); Tomohito Oda, Tokyo (JP); Koichiro Takashima, Tokyo (JP)

(73) Assignee: SONY CORPORATION, Tokyo (JP)

( * ) Notice: Subject to any disclaimer, the term of this patent is extended or adjusted under 35 U.S.C. 154(b) by 0 days.

(21) Appl. No.: 16/964,602

(22) PCT Filed: Nov. 2, 2018

(86) PCT No.: PCT/JP2018/040844
§ 371 (c)(1),
(2) Date: Jul. 24, 2020

(87) PCT Pub. No.: WO2019/150679
PCT Pub. Date: Aug. 8, 2019

(65) Prior Publication Data
US 2021/0048703 A1  Feb. 18, 2021

(30) Foreign Application Priority Data

Feb. 1, 2018 (JP) .............................. JP2018-016271

(51) Int. Cl.
*G02F 1/1333* (2006.01)
*G02F 1/1339* (2006.01)

(52) U.S. Cl.
CPC ...... *G02F 1/133308* (2013.01); *G02F 1/1339* (2013.01); *G02F 1/133314* (2021.01); *G02F 1/133331* (2021.01)

(58) Field of Classification Search
None
See application file for complete search history.

(56) References Cited

U.S. PATENT DOCUMENTS

2010/0265656 A1   10/2010   Yamaguchi et al.
2011/0077063 A1   3/2011    Yabe et al.
(Continued)

FOREIGN PATENT DOCUMENTS

| JP | 2010-251616 A | 11/2010 |
| JP | 2011-071876 A | 4/2011 |
| JP | 2015-144410 A | 8/2015 |

OTHER PUBLICATIONS

International Search Report and Written Opinion dated Dec. 18, 2018 for PCT/JP2018/040844 filed on Nov. 2, 2018, 7 pages including English Translation of the International Search Report.

*Primary Examiner* — Phu Vu
(74) *Attorney, Agent, or Firm* — Xsensus LLP

(57) ABSTRACT

To provide a display device that implements highly reliable waterproofness without reducing the ratio of a display member in a housing. The display device includes a display member having a flat-plate shape, a frame provided on a peripheral edge of a back surface facing a display surface of the display member, and a housing member provided on a side surface of the display member to surround the display surface, in which the housing member is provided with adhesive members on surfaces substantially parallel to the display surface and different from each other on a long side and a short side of the housing member, and at least one or more corners of four corners of the display surface are provided with a connecting adhesive member that connects the adhesive member of the long side of the housing member and the adhesive member of the short side of the housing member.

20 Claims, 7 Drawing Sheets

(56) References Cited

U.S. PATENT DOCUMENTS

2015/0185537 A1     7/2015   Yamashita et al.
2016/0366773 A1    12/2016   Esterbauer et al.
2017/0336668 A1*   11/2017   Xu ........................ G02F 1/1335
2017/0371197 A1*   12/2017   Hirabayashi ...... G02F 1/133308

* cited by examiner

DISPLAY DEVICE WITH ADHESIVE FRAME AND CORNER ADHESIVE CONNECTION MEMBER

CROSS-REFERENCE TO RELATED APPLICATIONS

The present application is based on PCT filing PCT/JP2018/040844, filed Nov. 2, 2018, which claims priority to JP 2018-016271, filed Feb. 1, 2018, the entire contents of each are incorporated herein by reference.

TECHNICAL FIELD

The present invention relates to a display device.

BACKGROUND ART

A mobile terminal device such as a mobile phone or a smartphone includes a display member such as a liquid crystal display panel for displaying information. In recent years, in a mobile terminal device, the size of a display member has become large to increase the amount of displayable information or to improve visibility of information to be displayed.

Meanwhile, the mobile terminal device is used in an external environment where the mobile terminal device is likely to be exposed to moisture, dust, or the like, and thus has waterproofness. However, in a case of implementing highly reliable waterproofness in the mobile terminal device, a waterproof structure becomes complicated or large, so the thickness of the mobile terminal device increases or the ratio of the display member decreases.

Therefore, highly reliable and space-saving waterproof technologies have been studied. For example, Patent Document 1 below discloses a technology for implementing highly reliable waterproofness while minimizing an increase in the thickness of a mobile terminal device.

CITATION LIST

Patent Document

Patent Document 1: Japanese Patent Application Laid-Open No. 2011-71876

SUMMARY OF THE INVENTION

Problems to be Solved by the Invention

However, the technology disclosed in Patent Document 1 is a waterproof technology for a mobile terminal device having upper and lower housings that are slidably connected. Therefore, it has been difficult to apply the technology disclosed in Patent Document 1 to a mobile terminal device such as a smartphone in which a display member occupies most of a housing.

Therefore, in a display device in which a display member occupies most of a housing, a technology for implementing highly reliable waterproofness without decreasing the ratio of the display member in the housing has been required.

Solutions to Problems

According to the present disclosure, there is provided a display device including a display member having a flat-plate shape, a frame member provided on a peripheral edge of a back surface facing a display surface of the display member, and a housing member provided on a side surface of the display member to surround the display surface, in which the housing member is provided with adhesive members on surfaces substantially parallel to the display surface and different from each other on a long side and a short side of the housing member, and at least one or more corners of four corners of the display surface are provided with a connecting adhesive member that connects the adhesive member of the long side of the housing member and the adhesive member of the short side of the housing member.

According to the present disclosure, the adhesive member for bonding the frame member and the housing member is provided below the display member. Therefore, the display member and the adhesive member can be provided to overlap in a thickness direction of the display device. Therefore, according to the display device of the present disclosure, the display member can be provided up to the vicinity of the housing member without interfering with a region where the adhesive member is provided.

Effects of the Invention

As described above, according to the present disclosure, highly reliable waterproofness can be implemented in a display device in which a display member occupies most of a housing.

Note that the above-described effect is not necessarily limited, and any of effects described in the present specification or other effects that can be grasped from the present specification may be exerted in addition to or in place of the above-described effect.

MODE FOR CARRYING OUT THE INVENTION

A favorable embodiment of the present disclosure will be described in detail with reference to the appended drawings. Note that, in the present specification and drawings, redundant description of configuration elements having substantially the same functional configuration is omitted by providing the same sign.

Note that the description will be given in the following order.
1. Structure of Display Device
2. Specific Structure of Display Device
3. Modification
3.1. First Modification
3.2. Second Modification
3.3. Third Modification

1. STRUCTURE OF DISPLAY DEVICE

First, a structure of a display device according to an embodiment of the present disclosure will be described with reference to FIGS. 1A to 1C, and FIG. 2. The display device according to the present embodiment is, for example, a mobile terminal device provided with a display member, of mobile terminal devices such as a mobile phone, a smartphone, a wristwatch-type terminal (so-called smart watch), and a wristband-type terminal (so-called smart band).

Figure 1A:
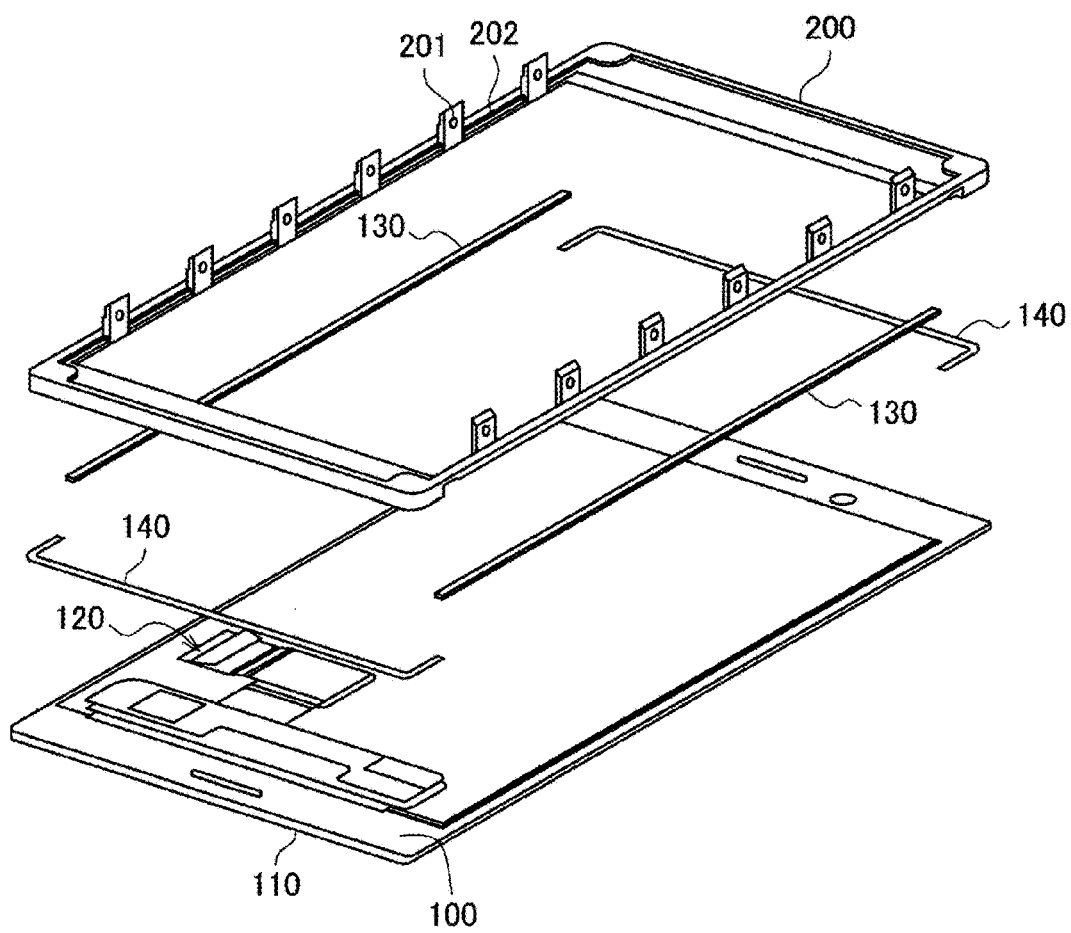
FIG. 1A is a perspective view partially illustrating a schematic structure of a display device according to an embodiment of the present disclosure.
Figure 1B:
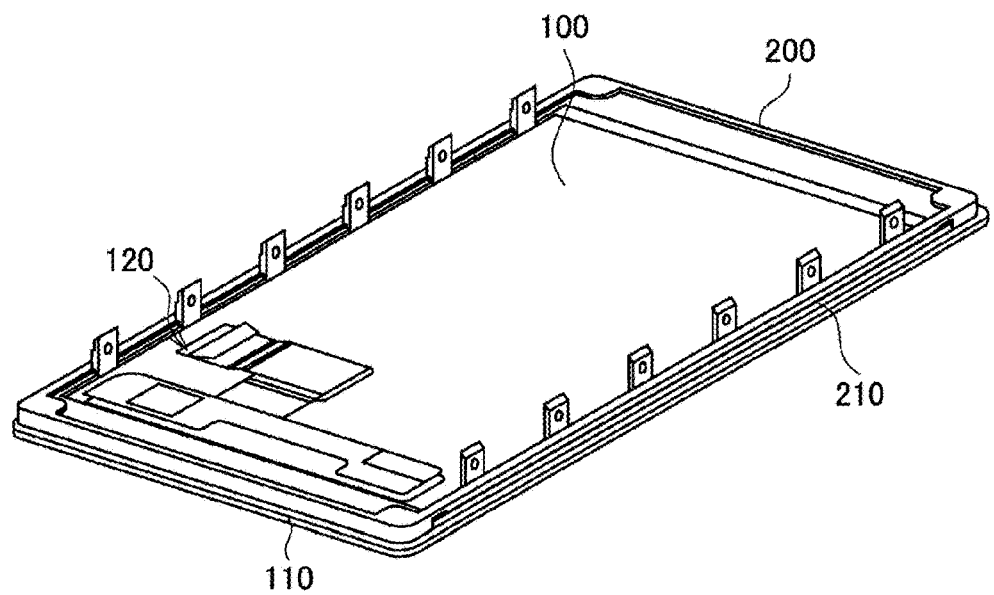
FIG. 1B is a perspective view illustrating a structure in which a sealing member is further added to the partial structure of the display device illustrated in FIG. 1A.
Figure 1C:
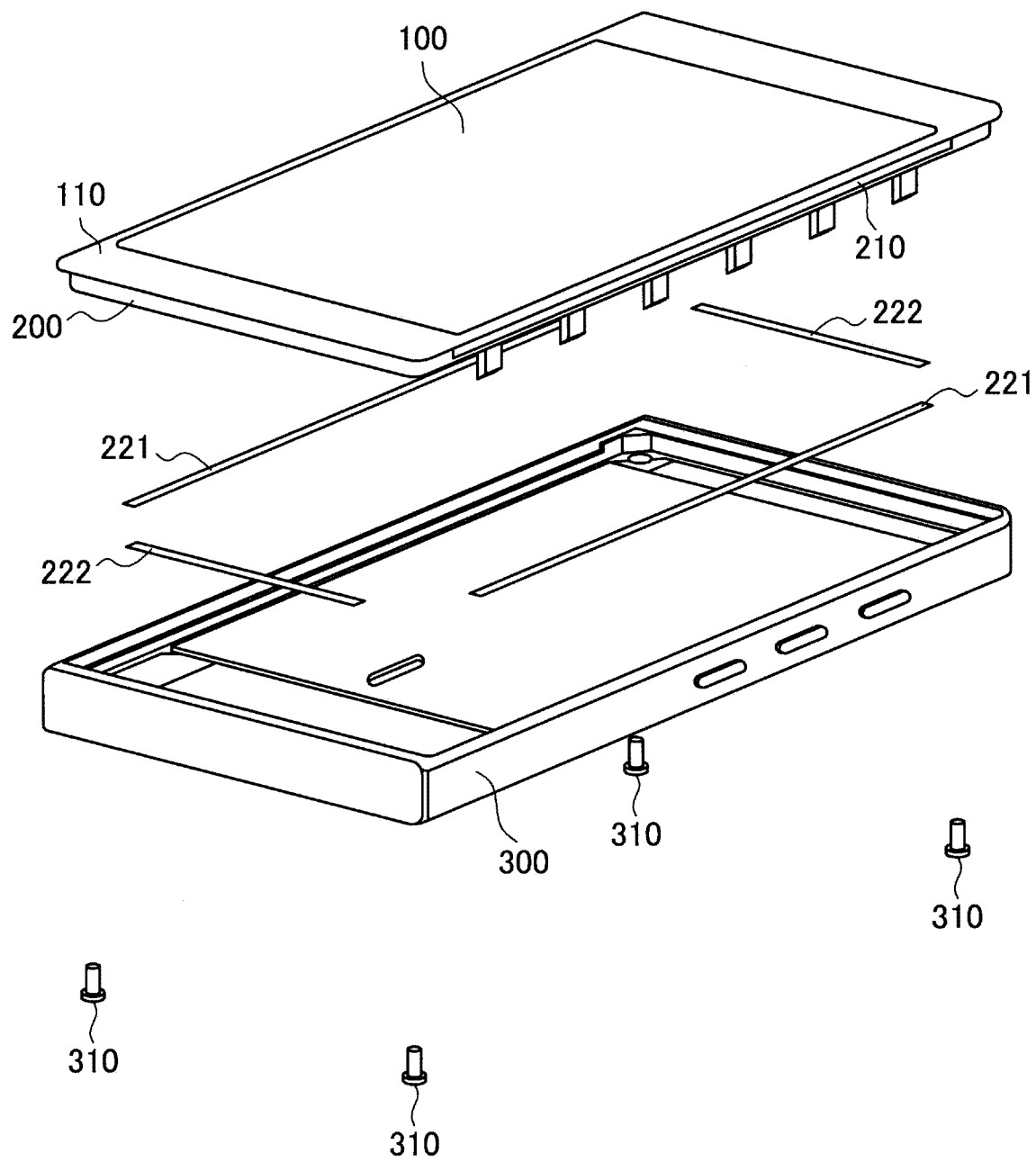
FIG. 1C is a perspective view illustrating a structure obtained by turning the partial structure of the display device illustrated in FIG. 1B upside down and attaching the turned partial structure to a housing member.

As illustrated in FIGS. 1A to 1C, the display device according to the present embodiment is configured by providing a sealing member 210 in a partial structure of the display device illustrated in FIG. 1A, as illustrated in FIG. 1B, and assembling the partial structure with a housing member 300, as illustrated in FIG. 1C. FIGS. 1A to 1C are perspective views illustrating the structure of the display device according to the present embodiment step by step. Specifically, FIG. 1B illustrates a structure obtained by further adding the sealing member to the partial structure of the display device illustrated in FIG. 1A, and FIG. 1C illustrates a structure obtained by turning a partial structure of the display device illustrated in FIG. 1B upside down and attaching the turned partial structure to a housing member.

The partial structure of the display device illustrated in FIG. 1A includes a display member 100, a cover glass 110, an electronic member 120, a gasket 130, an adhesive tape 140, and a frame member 200 having a protrusion 201 and a frame 202.

The display member 100 is a display module for displaying information such as images or characters, and is provided in, for example, a rectangular or substantially rectangular flat-plate shape. The display member 100 may be provided to be able to input information by further including an input device such as a touch panel. The display member 100 is provided to have a display surface facing a foreside of the display device (that is, a front side of the display device, for example. In FIG. 1A, a surface side facing below when the reader directly faces the paper surface). The display member 100 may be, for example, a liquid crystal display, an organic electro luminescence (EL) display, or the like. Note that the technology according to the present disclosure can be used particularly in a display device using a liquid crystal display having a large thickness and having a difficulty in securing waterproofness alone as the display member 100.

The cover glass 110 protects the display member 100 from impact, scratches, or the like. The cover glass 110 may be provided as a part of a main body and having a larger rectangular or larger substantially rectangular flat-plate shape than the display member 100 on the foreside (that is, the front side) of the display device. The cover glass 110 may be configured by, for example, tempered glass, sapphire glass, or the like that is transparent and has high impact resistance. Note that, it goes without saying that the cover glass 110 may be configured by an organic resin or the like other than the above glass as long as it is transparent.

The electronic member 120 is an electronic board or an electronic module for executing information processing for various controls of the display device. The electronic member 120 is provided on a back surface side facing the display surface of the display member 100, and can be electrically connected to each part of the display device by wiring or the like. The electronic member 120 may be, for example, a flexible substrate on which an electronic circuit and the like are mounted.

The gasket 130 is a sealing material for enhancing airtightness and liquid tightness between the display member 100 and the frame member 200. The gaskets 130 are respectively provided on, for example, the sides of long sides of the display member 100 in a region sandwiched by the display member 100 and the frame member 200. The gasket 130 may be configured by a known material having high cushioning and sealing properties, and may be configured by, for example, rubber or the like.

The adhesive tape 140 bonds the display member 100 and the frame member 200. The adhesive tapes 140 are respectively provided on the sides of short sides of the display member 100 in a region sandwiched by the display member 100 and the frame member 200. The adhesive tape 140 is configured by, for example, a known double-sided tape or the like, and fixes the display member 100 and the frame member 200 to adhere to each other.

The frame member 200 is provided on a peripheral edge on the back surface side facing the display surface of the display member 100, and increases rigidity of the display device. Specifically, the frame member 200 is provided to include the frame 202 and the protrusion 201, and is joined to the display member 100 via the gaskets 130 and the adhesive tapes 140.

The frame 202 is provided on the peripheral edge of the back surface of the display member 100 in an in-plane direction of the display member 100, and is provided as a frame-shaped member for supporting the display member 100. The protrusion 201 is provided to protrude from the frame 202 on the back surface of the display member 100 in a thickness direction of the display member 100, and serves as a screw for fixing the frame member 200 to a housing member 300 described below.

A partial structure of the display device illustrated in FIG. 1B further includes a sealing member 210 with respect to a joined structure in which the cover glass 110, the electronic member 120, the display member 100, and the frame member 200 illustrated in FIG. 1A are joined.

The sealing member 210 is a sealing material provided on each of the side surfaces on the sides of the long sides of the display member 100. The sealing member 210 seals the side surface on the side of the long side of the display member 100, thereby preventing entry of moisture or dust to an inside of the display member 100. The sealing member 210 may be configured by, for example, an organic resin having curability, and may be configured by, for example, an epoxy-based adhesive or an acrylic-based adhesive. In the case where the sealing member 210 is configured by such an organic resin, the sealing member 210 can be easily provided on the side surface of the display member 100 by applying the sealing member 210 before curing.

Note that, since side surfaces on the sides of short sides of the display member 100 are covered with the frame member 200, entry of the moisture or dust into the display member 100 can be prevented by separately providing adhesive members for sealing on the sides of the short sides of the display member 100. Furthermore, a mechanism such as a speaker, a camera, a sensor, or a button can be provided on the sides of the short sides of the display device. Therefore, to improve water resistance and dust resistance of these mechanisms, an adhesive member for sealing other than the above-described sealing member 210 may be further provided.

The display device illustrated in FIG. 1C includes the joined structure in which the cover glass 110, the display member 100, and the frame member 200 are joined illustrated in FIG. 1B, adhesive members 221 and 222, the housing member 300, and a fixing screw 310.

The housing member 300 is provided in a substantially rectangular parallelepiped shape with an open surface facing the back surface side of the display member 100. A structure obtained by turning the joined structure in which the cover glass 110, the display member 100, and the frame member 200 illustrated in FIG. 1B are joined upside down is assembled with the housing member 300 via the adhesive members 221 and 222. Thereafter, the housing member 300 is mechanically fixed to the joined structure by the fixing screw 310. Thereby, the housing member 300 accommodates the joined structure illustrated in FIG. 1B.

The housing member 300 may be configured by, for example, an organic resin such as engineering plastic having high strength and hardness, or may be configured by a metal such as aluminum, magnesium, or stainless steel. Note that a battery, a communication module, a camera or a sensor, a control circuit thereof, and the like in addition to the display member 100 may be accommodated in the housing member 300 although not illustrated.

The housing member 300 may be mechanically fixed to the frame member 200 with the fixing screw 310. The position where the housing member 300 and the frame member 200 are screwed with the fixing screw 310 may be, for example, the protrusion 201 of the frame member 200 or the four corners of the frame member 200.

The housing member 300 is caused to adhere to the cover glass 110 and the frame member 200 via the adhesive members 221 and 222. Specifically, the adhesive members 221 and 222 cause the housing member 300 and the cover glass 110 and the frame member 200 to adhere to each other on each side of the housing member 300. The adhesive members 221 and 222 have waterproof and sealing properties and prevent entry of the moisture or dust through an adhesive surface between the housing member 300 and the cover glass 110 and the frame member 200. The adhesive members 221 and 222 may be, for example, a known double-sided tape or an adhesive.

Figure 2:
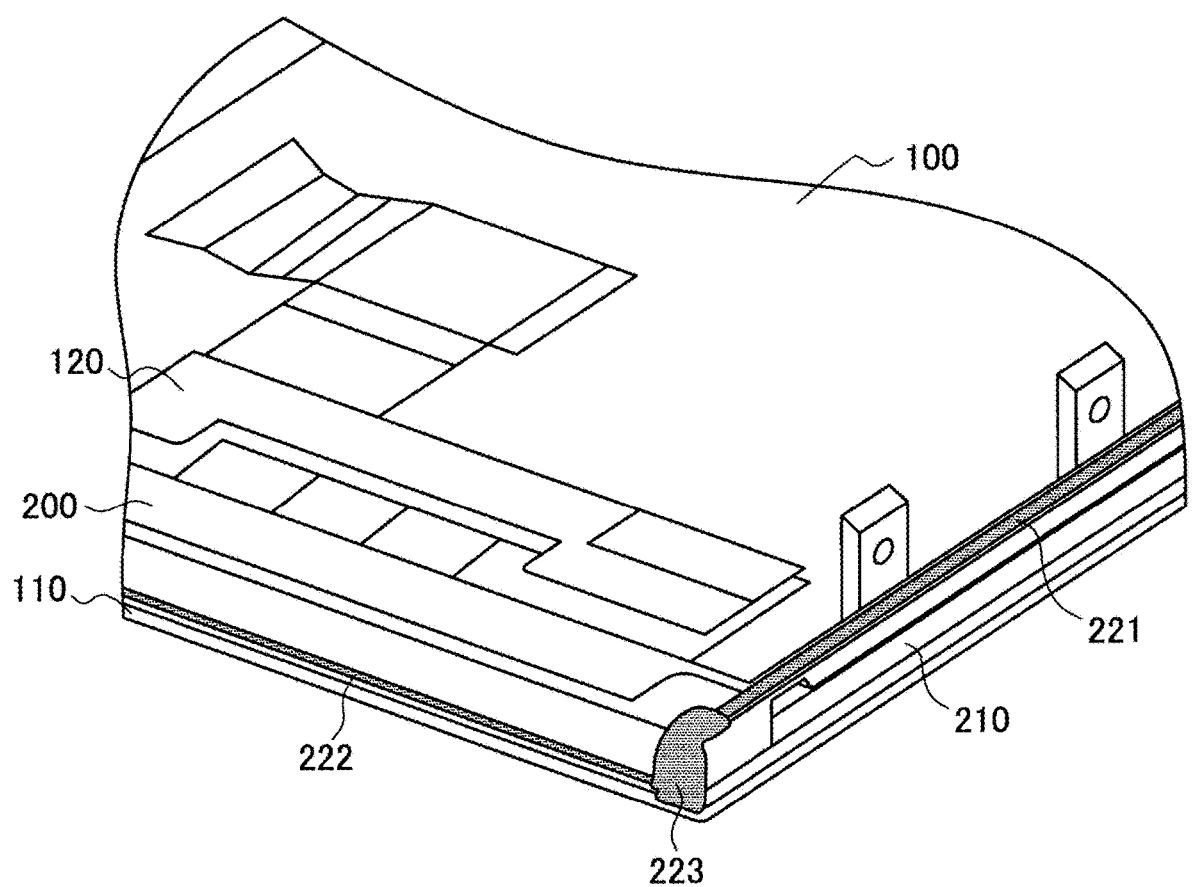
FIG. 2 is a perspective view of the partial structure of the display device illustrated in FIG. 1B with enlarged four corners.

Here, the adhesive member 221 for bonding each of the long sides of the housing member 300 and the adhesive member 222 for bonding each of the short sides of the housing member 300 are provided on planes substantially parallel to the display surface of the display member 100 and different from each other. Furthermore, a connecting adhesive member 223 that connects the adhesive member 221 for bonding the long side of the housing member 300 and the adhesive member 222 for bonding the short side of the housing member 300 is provided at each of the four corners of the housing member 300. This configuration will be described with reference to FIG. 2. FIG. 2 is a perspective view of the partial structure of the display device illustrated in FIG. 1B with enlarged four corners.

As illustrated in FIG. 2, the adhesive member 221 for bonding the long side of the housing member 300 may be provided on one surface of the frame member 200 joined to the housing member 300, the one surface being substantially parallel to the display surface of the display member 100, for example. Specifically, the adhesive member 221 may be provided on one surface substantially parallel to the display surface of the display member 100, the one surface being one of surfaces of the frame 202 included in the frame member 200. Furthermore, the adhesive member 222 for bonding the short side of the housing member 300 may be provided on one surface of the cover glass 110 joined to the housing member 300, the one surface being substantially parallel to the display surface of the display member 100, for example. Specifically, the adhesive member 222 may be provided on one surface of the cover glass 110 protruding from the frame member 200.

This is because adhesive regions suitable for sealing the display member 100 and the like to be accommodated are different between the long side and the short side of the housing member 300. Specifically, the waterproofness of the display member 100 is secured by the sealing member 210. Therefore, the adhesive member 221 can be provided such that the ratio occupied by the display member 100 with respect to the housing member 300 becomes large on the short side of the housing member 300. Meanwhile, the waterproofness of a mechanism such as a speaker, a camera, a sensor, or a button that can be provided on the sides of the long sides of the housing member 300 is not secured by the mechanism alone. Therefore, on the long side of the housing member 300, the adhesive member 222 is provided in a region close to the display surface of the display member 100, in a joint surface between the housing member 300 and the cover glass 110. Thereby, the adhesive member 222 can secure the waterproofness for the mechanism such as a speaker, a camera, a sensor, or a button.

Moreover, in the present embodiment, the connecting adhesive member 223 that connects the adhesive member 221 for bonding the long side of the housing member 300 and the adhesive member 222 for bonding the short side of the housing member 300 is provided at each of the four corners of the housing member 300. Specifically, the connecting adhesive member 223 is provided over an adhesive surface of the long side of the housing member 300 and over an adhesive surface of the short side of the housing member 300, and causes a corner of the housing member 300 to adhere to the frame member 200 or the cover glass 110. According to the configuration, the connecting adhesive member 223 connects the adhesive member 221 and the adhesive member 222 provided on the planes different from each other, thereby securing the waterproof and sealing properties at the four corners of the housing member 300. Therefore, the display device can be provided with the adhesive members having the waterproof and sealing properties over the entire periphery of the housing member 300, thereby securing the highly reliable waterproofness. Since the connecting adhesive member 223 three-dimensionally connects the adhesive member 221 and the adhesive member 222 provide on the planes different from each other, the connecting adhesive member 223 may be configured as, for example, a paste-like adhesive member, and may be configured by, for example, a known adhesive or the like.

The structure of the display device according to the present embodiment has been described. The display device according to the present embodiment can be appropriately provided with the adhesive surface between the housing member 300 and the frame member 200 and the cover glass 110 at each of the short side and the long side of the display device, and can be provided with the adhesive members having the waterproofness over the entire periphery of the housing member 300. Therefore, according to the present embodiment, the highly reliable waterproofness can be implemented while increasing the ratio occupied by the display member 100 with respect to the housing member 300 in the display device.

2. SPECIFIC STRUCTURE OF DISPLAY DEVICE

Figure 3:
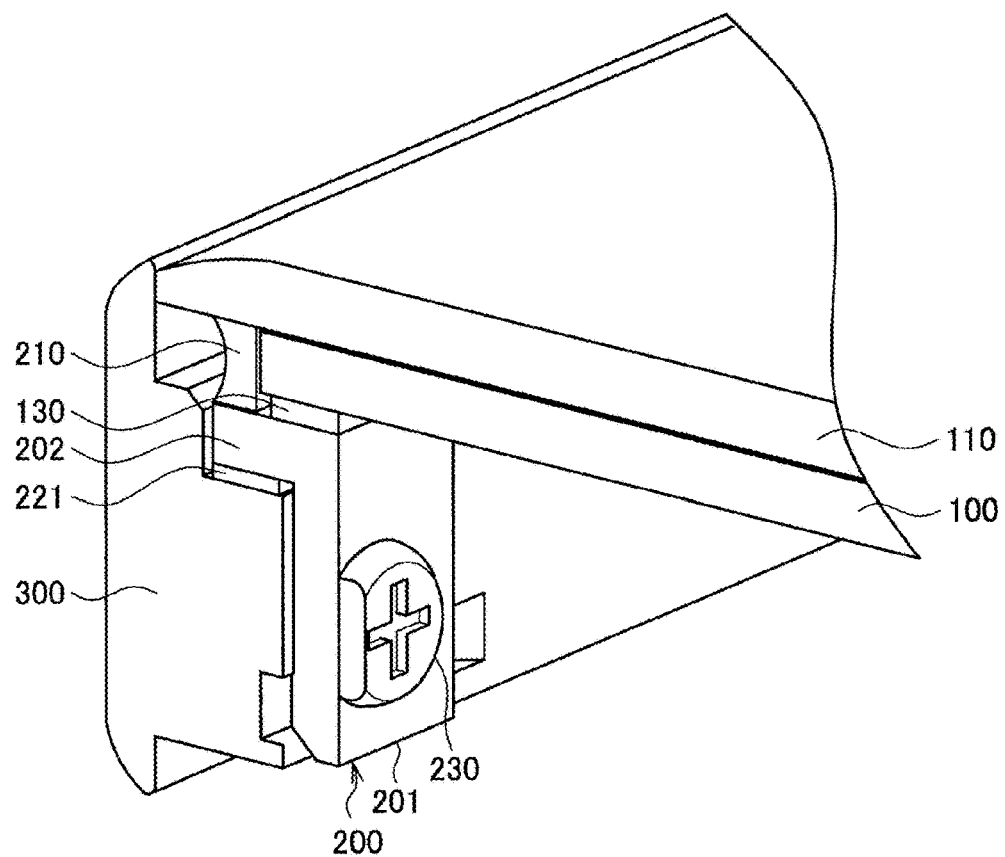
FIG. 3 is a perspective view illustrating a part of a cross section obtained by cutting the display device according to the embodiment along a surface perpendicular to a long side.
Figure 4:
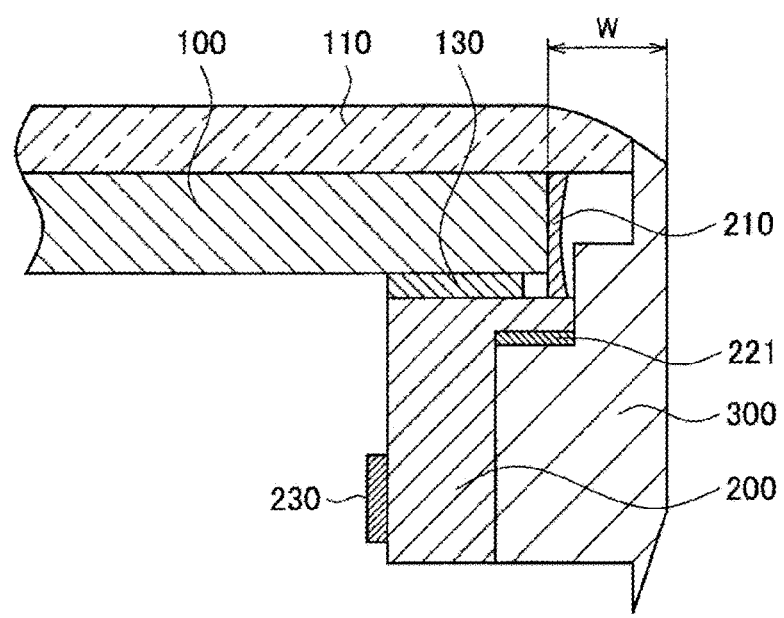
FIG. 4 is a cross-sectional view schematically illustrating a part of a cross section obtained by cutting the display device according to the embodiment along a surface perpendicular to a long side.

Next, a specific structure of the display device according to the present embodiment will be described with reference to FIGS. 3 to 6. FIG. 3 is a perspective view illustrating a part of a cross section obtained by cutting the display device according to the embodiment along a surface perpendicular to a long side, and FIG. 4 is a cross-sectional view schematically illustrating a part of a cross section obtained by cutting the display device according to the embodiment along a surface perpendicular to a long side. Note that, in FIGS. 3 and 4, illustration of the structure on the back side of the housing member 300, and the battery and the like accommodated inside the housing member 300 is omitted for simplification.

As illustrated in FIGS. 3 and 4, the cross section of the long side of the display device according to the present embodiment includes the cover glass 110, the display member 100, the gasket 130, the sealing member 210, the adhesive member 221, the frame member 200, a fixing screw 230, and the housing member 300.

The display member 100 is a display module for displaying information such as images or characters. Specifically, the display member 100 may be a liquid crystal display having a rectangular or substantially rectangular flat-plate shape and provided with the display surface on the surface facing outside of the housing member 300. Furthermore, the display member 100 may further include an input device such as a touch panel having a function to input information.

Figure 5:
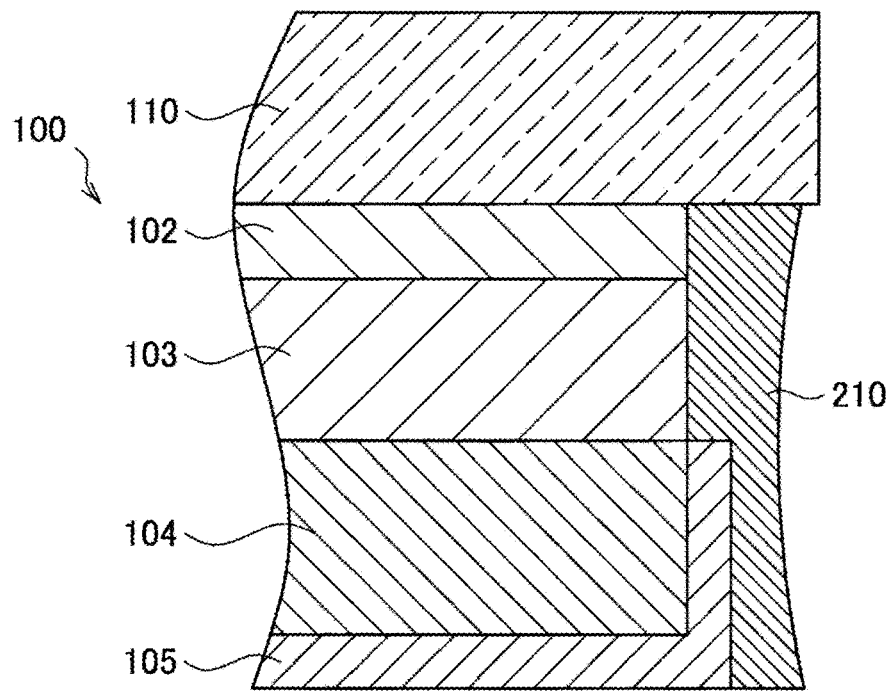
FIG. 5 is a schematic view illustrating a laminated structure of a liquid crystal display.

Here, as illustrated in FIG. 5, the liquid crystal display can be configured as a laminate of a plurality of components. FIG. 5 is a schematic view illustrating a laminated structure of the liquid crystal display.

As illustrated in FIG. 5, in a case where the display member 100 is a liquid crystal display, the display member 100 can include a laminate member 102, a liquid crystal cell 103, a backlight 104, and a display housing 105.

The laminate member 102 causes the liquid crystal cell 103 to adhere to the cover glass 110. For example, the laminate member 102 may be an optical paste having excellent light transmittance.

The liquid crystal cell 103 is configured by laminating a polarizing film, a color filter substrate, a liquid crystal layer, an array substrate, a polarizing film, and the like. The liquid crystal cell 103 can control the light transmittance of the liquid crystal cell 103 by controlling orientation of liquid crystal filling a liquid crystal layer.

The backlight 104 is a light source for the display member 100. Light emitted from the backlight 104 passes through the liquid crystal cell 103 and is emitted through the cover glass 110.

The display housing 105 is a structural member for securing overall strength of the display member 100.

Therefore, in the display member 100, the liquid crystal cell 103 controls the transmittance of the light from the backlight 104, so that pixels corresponding to an image to be displayed on the display member 100 can be illuminated.

As described above, since the liquid crystal display is configured as a laminate of a plurality of components, there is a possibility of occurrence of a malfunction in a case where the moisture or dust enters inside the laminate through a side surface of the liquid crystal display. In the present embodiment, the sealing member 210 is provided on the side surface of the long side of the display member 100 that is the liquid crystal display, whereby the waterproofness of the display member 100 can be improved.

The sealing member 210 is a sealing material provided on the side surface of the long side of the display member 100 and prevents entry of the moisture or dust into the display member 100. Specifically, the sealing member 210 is provided in a space sandwiched by the cover glass 110 protruding from the display member 100 and the frame member 200 so as to cover the side surface of the display member 100. For example, the sealing member 210 may be an epoxy adhesive or acrylic adhesive having curability and easily applied to the side surface of the display member 100.

Here, the sealing member 210 can be provided so as not to be in contact with the housing member 300. In a case where the sealing member 210 comes into contact with the housing member 300, unintended adhesion or the like occurs between the display member 100 and the housing member 300, which may complicate an assembly process of the display device. Note that it is conceivable to bring the sealing member 210 into contact with the housing member 300, thereby causing the sealing member 210 to further perform adhesion of the display member 100 and the housing member 300. In this case, selection of a material of the sealing member 210 that secures sufficient waterproofness and adhesiveness may be difficult. For example, in a case of securing the sufficient waterproofness and adhesiveness using a known organic resin having curability, the thickness of the sealing member 210 is made larger. Therefore, the size of the display member 100 with respect to the housing member 300 is decreased. Therefore, in the present embodiment, the sealing member 210 is provided so as not to be in contact with the housing member 300, so that the sealing member 210 is caused to have the function to secure the waterproofness of the display member 100, and the adhesive member 221 is caused to have the function to bond the display member 100 and the housing member 300.

The cover glass 110 is provided on the display surface side of the display member 100, and protects the display member 100 from impact, scratches, or the like. Specifically, the cover glass 110 may glass or the like having a rectangular or substantially rectangular flat-plate shape larger than the display member 100. For example, the cover glass 110 may be tempered glass, sapphire glass, or the like.

The gasket 130 is a sealing material for improving air-tightness and liquid tightness, and is provided between the display member 100 and the frame member 200. Specifically, the gasket 130 is provided between the back surface of the display member 100 and the frame 202 of the frame member 200 to be parallel to the display surface of the display member 100, and prevents entry of the moisture or dust into the housing member 300. For example, the gasket 130 the gasket 130 may be formed using rubber or the like having high cushioning and sealing properties.

The frame member 200 is provided on the back surface of the display member 100 via the gasket 130, and supports the display member 100. Specifically, the frame member 200 is provided in a frame shape on a peripheral edge of the back surface of the display member 100, and includes the frame 202 extending in the in-plane direction of the display member 100 and the protrusion 201 protruding from the frame 202 in the thickness direction of the display member 100. That is, the frame member 200 can be provided such that the cross-sectional shape cut along a surface perpendicular to the long side of the display device has a bent hook-like shape, in other words, an "L" shape. Note that the protrusion 201 functions as a screwing portion for fixing the frame member 200 and the housing member 300 to each other using the fixing screw 230.

The fixing screw 230 mechanically fixes the frame member 200 and the housing member 300. Specifically, the fixing screw 230 penetrates the protrusion 201 of the frame member 200 and screws the housing member 300. Thus, the fixing screw 230 can mechanically fix the frame member 200 and the housing member 300.

The housing member 300 is a main member constituting the housing of the display device. Specifically, the housing member 300 is provided in a substantially rectangular parallelepiped shape with one surface open, and the display member 100 and the cover glass 110 are provided to cover the open surface of the housing member 300. For example, the housing member 300 may be formed using engineering plastic having high strength and hardness, or aluminum, magnesium, stainless steel, or the like. For example, a battery, a communication module, a camera or a sensor, a control circuit thereof, and the like may be accommodated inside the housing member 300. Note that FIGS. 3 and 4 illustrate only a side wall of the housing member 300, and illustration of a bottom surface facing the opening surface of the housing member 300 is omitted.

Furthermore, in the side surface of the housing member 300, a step structure is provided on a surface side facing the inside of the housing member 300. Thereby, the step structure in the side wall of the housing member 300 can be fitted with the hook-like shape of the frame member 200. The housing member 300 is joined to the frame member 200 on a plurality of surfaces, thereby improving the adhesiveness between the housing member 300 and the frame member 200.

The adhesive member 221 is provided between the frame member 200 and the housing member 300, and causes the frame member 200 and the housing member 300 to adhere to each other. Thereby, the adhesive member 221 can prevent entry of the moisture, dust, or the like into the housing member 300 through the joint surface between the frame member 200 and the housing member 300. For example, the adhesive member 221 may be a double-sided tape or an adhesive.

Specifically, the adhesive member 221 can be provided on a surface parallel to the display surface of the display member 100, of the joint surfaces between the frame member 200 and the housing member 300. Therefore, the adhesive member 221 is provided on the surface below the display member 100, not the same surface as the display member 100. According to the configuration, the display member 100 can be provided up to a region close to the housing member 300 without considering a region necessary for adhesion of the adhesive member 221. Hereinafter, such a point will be described by comparing the structure of the display device according to the present embodiment illustrated in FIG. 4 with a structure of a display device according to a comparative example illustrated in FIG. 6.

Figure 6:
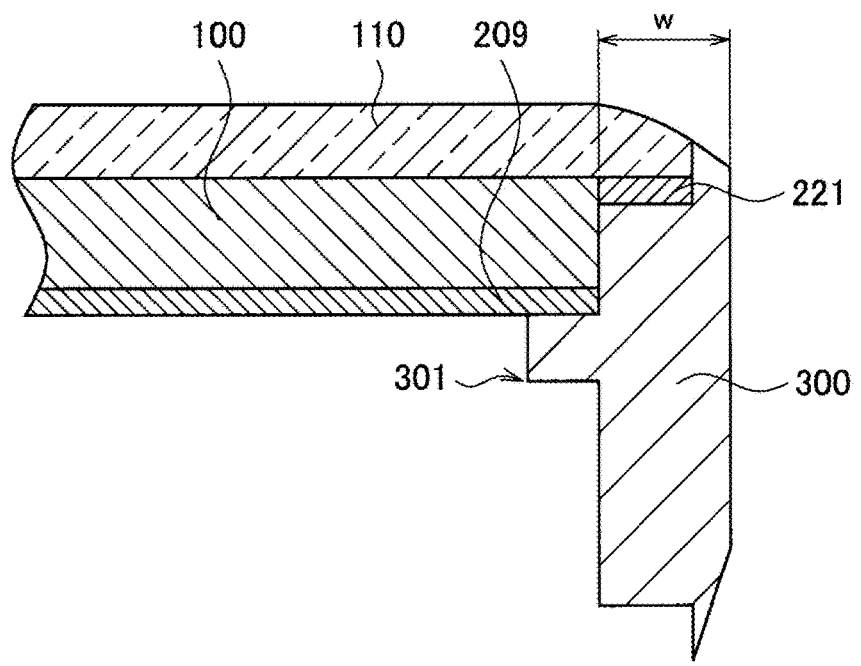
FIG. 6 is a cross-sectional view schematically illustrating a part of a cross section obtained by cutting a display device according to a comparative example along a surface perpendicular to a long side.

As illustrated in FIG. 6, in the display device according to the comparative example, a frame member 209 is provided in a flat plate shape on the back surface of the display member 100, and the sealing member 210 is not provided on the side surface of the display member 100. Furthermore, the display member 100 and the frame member 209 are provided on a projection 301 of the housing member 300, the projection 301 projecting in the in-plane direction of the display member 100. In the display device according to such a comparative example, the adhesive member 221 is provided between the cover glass 110 and the housing member 300, thereby preventing entry of moisture or dust into the display member 100 and entry of moisture or dust into the housing member 300.

At this time, in the display device according to the comparative example, the surface on which the adhesive member 221 is provided is provided side by side in the in-plane direction of the display member 100. Therefore, the display member 100 is provided separately from the housing member 300 by the amount of the region where the adhesive member 221 is provided. Therefore, in the display device according to the comparative example, the ratio occupied by the display member 100 with respect to the housing member 300 is decreased by the amount of the adhesive member 221 provided for securing the waterproofness of the display device. That is, a width w from the side end of the housing member 300 to the display member 100 is larger than at least a width of the region where the adhesive member 221 is provided.

Meanwhile, as illustrated in FIG. 4, in the display device according to the present embodiment, the adhesive member 221 is provided on the surface parallel to the display surface of the display member 100, of the joint surfaces between the frame member 200 having the hook-like shape in cross section and the housing member 300 having the step structure. At this time, in the display device according to the present embodiment, the surface where the adhesive member 221 is provided is provided below the display member 100, and thus the display member 100 and the adhesive member 221 are provided to overlap in the thickness direction of the display device. Therefore, according to the present embodiment, the display member 100 can be provided up to the vicinity of the housing member 300 without interfering with the region where the adhesive member 221 is provided. That is, a width W from the side end of the housing member 300 to the display member 100 is only required to be larger than the thickness of the sealing member 210 provided on the side surface of the display member 100, and can be reduced as compared with the width w illustrated in FIG. 6.

The specific structure of the display device according to the present embodiment has been described in detail. According to the display device of the present embodiment, the highly reliable waterproofness can be secured while making the ratio occupied by the display member 100 with respect to the housing member 300 large.

3. MODIFICATION

Next, modifications of the display device according to the present embodiment will be described with reference to FIGS. 7 to 9.

3.1. First Modification

First, a first modification of the display device according to the present embodiment will be described with reference to FIG. 7. FIG. 7 is a schematic view illustrating a laminated structure of a display member 101 of the display device according to the first modification. Note that the laminated structure of the display member 101 illustrated in FIG. 7 corresponds to the laminated structure of the display member 100 illustrated in FIG. 5.

Figure 7:
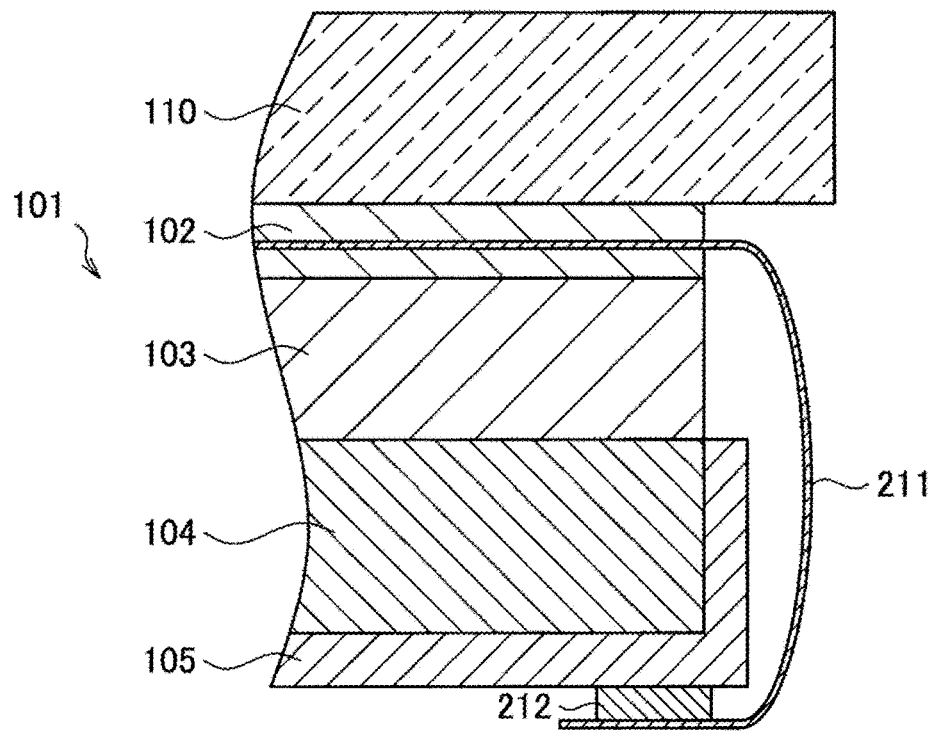
FIG. 7 is a schematic view illustrating a laminated structure of a display member of a display device according to a first modification.

As illustrated in FIG. 7, in the first modification, the display member 101 is a liquid crystal display, and the display member 101 can include the laminate member 102, the liquid crystal cell 103, the backlight 104, and the display housing 105. In the first modification, a film member constituting the display member 101 is used as a sealing member 211 provided on a side surface of the display member 101 and used to seal the side surface of the display member 101.

Specifically, the sealing member 211 is an optical film such as a polarizing film included in the display member 101 that is a liquid crystal display. The sealing member 211 is provided to extend from a display region of the display member 101, covers the side surface of the display member 101, and is fixed with a tape 212 on the back surface facing the display surface of the display member 101. Even with such a configuration, the sealing member 211 can cover the side surface of the display member 101, thereby preventing entry of the moisture or dust into the display member 101 through the side surface of the display member 101. Note that an adhesive region of the tape 212 is also three-dimensionally provided so that the sealing member 211 can three-dimensionally seal the display member 101 at four corners of the display member 101.

According to the first modification, the film member constituting the display member 101 that is a liquid crystal display can be used as the sealing member 211. Therefore, a manufacturing process of the display device can be simplified and a manufacturing cost can be reduced. However, in a case where the display member 101 does not have an optical film that can serve as the above-described sealing member 211, the side surface of the display member 100 may be sealed using the organic resin having curability as the sealing member 210, as illustrated in FIG. 5.

3.2. Second Modification

Next, a second modification of the display device according to the present embodiment will be described with reference to FIG. 8. FIG. 8 is a cross-sectional view schematically illustrating a part of a cross section obtained by cutting the display device according to the second modification along a surface perpendicular to a long side. Note that the cross section of the display device illustrated in FIG. 8 corresponds to the cross section of the display device illustrated in FIG. 4.

Figure 8:
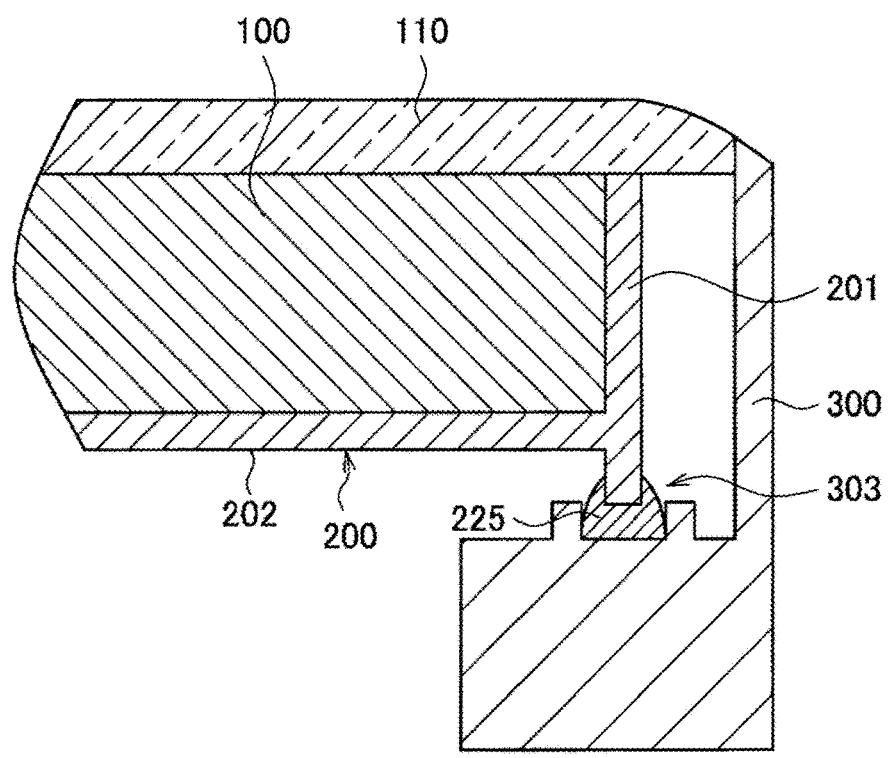
FIG. 8 is a cross-sectional view schematically illustrating a part of a cross section obtained by cutting a display device according to a second modification along a surface perpendicular to a long side.

As illustrated in FIG. 8, in the second modification, the housing member 300 is provided with a step structure in a side surface on a side facing the display member 100, and is provided with an adhesive member 225 on a surface of the step structure, the surface being parallel to the display surface of the display member 100. Furthermore, the frame member 200 includes the frame 202 extending in the in-plane direction of the display member 100 and the protrusion 201 extending from the frame 202 in the thickness direction of the display member 100. Here, the protrusion 201 of the frame member 200 is provided such that extending both ends are each in contact with the cover glass 110 and the adhesive member 225 provided on the housing member 300.

Specifically, the adhesive member 225 is formed using a low-resilience material having high shock absorption, and for example, the low-resilience material may be a low-resilience material in the form of a gel, a low-resilience material containing silicon or propylene, or a low-resilience material such as a soft urethane foam. The adhesive member 225 is provided inside a recess structure 303 provided on the surface parallel to the display surface of the display member 100, of the step structure of the housing member 300, and receives pressure from the protrusion 201 of the frame member 200. Even with such a configuration, the adhesive member 225 can bond the frame member 200 and the housing member 300, and can prevent entry of moisture or dust into the housing member 300 through the adhesive surface between the frame member 200 and the housing member 300.

According to the second modification, the pressure caused by a mass of the display member 100 supported by the frame member 200 can be received by the cover glass 110 and the adhesive member 225 formed using the low-resilience material. According to this configuration, local application of the pressure due to the own weight to the display member 100 can be prevented. Therefore, occurrence of a distortion in the display surface of the display member 100 due to a stress can be prevented. Therefore, according to the display device of the second modification, the quality of an image displayed on the display member 100 can be improved.

3.3. Third Modification

Next, a third modification of the display device according to the present embodiment will be described with reference to FIG. 9. FIG. 9 is a perspective view illustrating a part of a cross section obtained by cutting the display device according to the third modification along a surface perpendicular to a long side. Note that the cross section of the display device illustrated in FIG. 9 corresponds to the cross section of the display device illustrated in FIG. 3.

Figure 9:
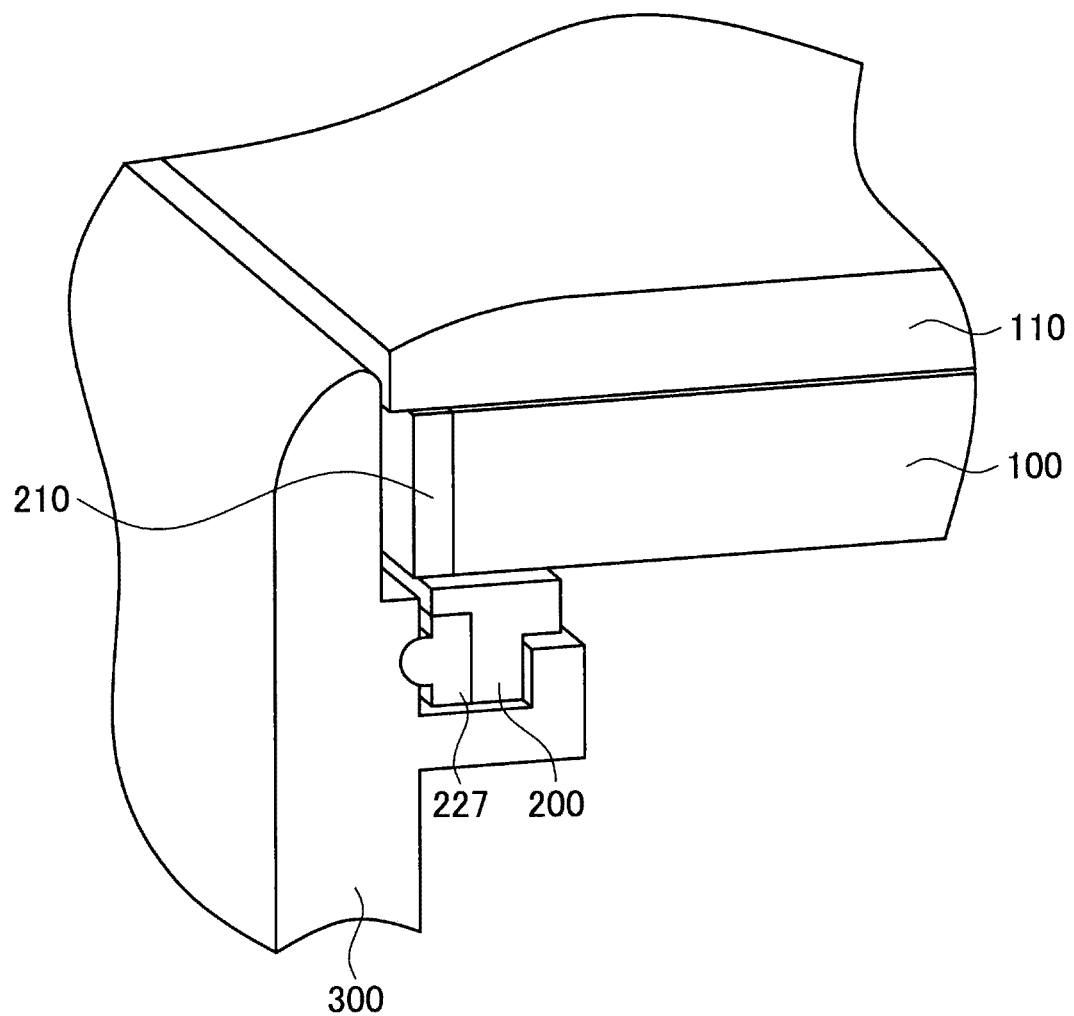
FIG. 9 is a perspective view illustrating a part of a cross section obtained by cutting the display device according to a third modification along a surface perpendicular to a long side.

As illustrated in FIG. 9, in the third modification, an adhesive member 227 is provided between the frame member 200 and the housing member 300. Here, the adhesive member 227 may be sandwiched by the frame member 200 and the housing member 300 in the in-plane direction of the display member 100 rather than being sandwiched by the frame member 200 and the housing member 300 in the thickness direction of the display member 100. In such a case, the adhesive member 227 can be provided to extend in a surface substantially perpendicular to the display surface of the display member 100. The adhesive member 227 may be, for example, a known adhesive or a double-sided tape, or may be a liquid silicon rubber (liquid injection mold) or the like that can be formed to be thicker.

According to the third modification, the degree of freedom of layout of the adhesive member 227 for preventing entry of moisture or dust into the housing member 300 through the joint surface between the frame member 200 and the housing member 300 can be improved. Therefore, in the display device according to the third modification, each member can be arranged inside the housing member 300 with a higher degree of freedom.

Although the favorable embodiment of the present disclosure has been described in detail with reference to the accompanying drawings, the technical scope of the present disclosure is not limited to such examples. It is obvious that persons having ordinary knowledge in the technical field of the present disclosure can conceive various changes and alterations within the scope of the technical idea described in the claims, and it is naturally understood that these changes and alterations belong to the technical scope of the present disclosure.

For example, the technology according to the present disclosure can be applied to any device including a display unit. Specifically, the technology according to the present disclosure can be applied to a mobile terminal device including a display member such as a mobile phone, a smartphone, a wristwatch-type terminal (so-called smart watch), and a wristband-type terminal (so-called smart band).

Furthermore, the display member included in the display device according to the present embodiment is not limited to a liquid crystal display and may be an organic electro luminescence (EL) display.

Furthermore, the effects described in the present specification are merely illustrative or exemplary and are not restrictive. That is, the technology according to the present disclosure can exhibit other effects obvious to those skilled in the art from the description of the present specification together with or in place of the above-described effects.

Note that following configurations also belong to the technical scope of the present disclosure.

(1)
A display device including:
a display member having a flat-plate shape;
a frame member provided on a peripheral edge of a back surface facing a display surface of the display member; and
a housing member provided on a side surface of the display member to surround the display surface, in which
the housing member is provided with adhesive members on surfaces substantially parallel to the display surface and different from each other on a long side and a short side of the display member, and
at least one or more corners of four corners of the display surface are provided with a connecting adhesive member that connects the adhesive member of the long side of the housing member and the adhesive member of the short side of the housing member.

(2)
The display device according to (1), in which the side surface of the display member is provided with a sealing member.

(3)
The display device according to (2), in which the sealing member is provided in non-contact with the housing member.

(4)
The display device according to (2) or (3), in which the sealing member contains an organic resin having curability.

(5)
The display device according to (4), in which a cover glass is further provided on the display surface of the display member, and
the sealing member is provided in a space sandwiched by the cover glass provided to protrude from the display member in an in-plane direction of the display member and the frame member.

(6)
The display device according to (2) or (3), in which the sealing member includes a film member that covers the side surface of the display member.

(7)
The display device according to (6), in which the film member includes an optical film included in the display member.

(8)
The display device according to any one of (1) to (7), in which
the frame member includes a frame provided in an in-plane direction of the display member and a protrusion protruding in a thickness direction of the display member, and
a cross-sectional shape of the frame member in the thickness direction of the display member is a hook-like shape.

(9)
The display device according to (8), in which
the housing member is provided with a step structure on a side facing the display member, and
the hook-like shape of the frame member is fitted with the step structure of the housing member.

(10)
The display device according to (9), in which the adhesive member of the long side of the housing member is provided on a fitting surface of the step structure and the hook-like shape.

(11)
The display device according to (9) or (10), in which the frame member is mechanically fixed to the housing member at the protrusion.

(12)
The display device according to any one of (1) to (7), in which
the frame member includes a protrusion protruding in a thickness direction of the display member, and
the protrusion is in contact with the housing member via a low-resilience material.

(13)
The display device according to (12), in which the low-resilience material is provided inside a recess structure formed in the housing member.

(14)
The display device according to (12) or (13), in which
a cover glass is further provided on the display surface of the display member, and
the frame member is in contact with the cover glass on a side facing a side where the protrusion is in contact with the housing member.

(15)
The display device according to any one of (1) to (14), in which the display member includes a liquid crystal display.

REFERENCE SIGNS LIST

100 Display member
110 Cover glass
120 Electronic member
130 Gasket
140 Adhesive tape
200 Frame member
201 Protrusion
202 Frame
210 Sealing member
221, 222 Adhesive member
223 Connecting adhesive member
300 Housing member
310 Fixing screw

The invention claimed is:
1. A display device comprising:
a display member having a flat-plate shape;
a frame member provided on a peripheral edge of a back surface facing a display surface of the display member; and
a housing member provided on a side surface of the display member to surround the display surface, wherein
the housing member is provided with adhesive members on surfaces substantially parallel to the display surface and different from each other on a long side and a short side of the housing member,
at least one or more corners of four corners of the display surface are provided with a connecting adhesive member that connects the adhesive member of the long side of the housing member and the adhesive member of the short side of the housing member,
the frame member includes a protrusion protruding in a thickness direction of the display member, and
the protrusion is in contact with the housing member via a low-resilience material.

2. The display device according to claim 1, wherein the side surface of the display member is provided with a sealing member.

3. The display device according to claim 2, wherein the sealing member is provided in non-contact with the housing member.

4. The display device according to claim 2, wherein the sealing member contains an organic resin having curability.

5. The display device according to claim 4, wherein
a cover glass is further provided on the display surface of the display member, and
the sealing member is provided in a space sandwiched by the cover glass provided to protrude from the display member in an in-plane direction of the display member and the frame member.

6. The display device according to claim 2, wherein the sealing member includes a film member that covers the side surface of the display member.

7. The display device according to claim 6, wherein the film member includes an optical film included in the display member.

8. The display device according to claim 1, wherein
the frame member includes a frame provided in an in-plane direction of the display member, and
a cross-sectional shape of the frame member in the thickness direction of the display member is a hook-like shape.

9. The display device according to claim 8, wherein
the housing member is provided with a step structure on a side facing the display member, and
the hook-like shape of the frame member is fitted with the step structure of the housing member.

10. The display device according to claim 9, wherein the adhesive member of the long side of the housing member is provided on a fitting surface of the step structure and the hook-like shape.

11. The display device according to claim 9, wherein the frame member is mechanically fixed to the housing member at the protrusion.

12. The display device according to claim 1, wherein the low-resilience material is provided inside a recess structure formed in the housing member.

13. The display device according to claim 1, wherein
a cover glass is further provided on the display surface of the display member, and
the frame member is in contact with the cover glass on a side facing a side where the protrusion is in contact with the housing member.

14. The display device according to claim 1, wherein the display member includes a liquid crystal display.

15. A display device comprising:
a display member having a flat-plate shape;
a frame member provided on a peripheral edge of a back surface facing a display surface of the display member; and
a housing member provided on a side surface of the display member to surround the display surface, wherein
the housing member is provided with adhesive members on surfaces substantially parallel to the display surface and different from each other on a long side and a short side of the housing member,
at least one or more corners of four corners of the display surface are provided with a connecting adhesive member that connects the adhesive member of the long side of the housing member and the adhesive member of the short side of the housing member,
the frame member includes a frame provided in an in-plane direction of the display member and a protrusion protruding in a thickness direction of the display member, and
a cross-sectional shape of the frame member in the thickness direction of the display member is a hook-like shape,
the housing member is provided with a step structure on a side facing the display member,
the hook-like shape of the frame member is fitted with the step structure of the housing member, and
the adhesive member of the long side of the housing member is provided on a fitting surface of the step structure and the hook-like shape.

16. The display device according to claim 15, wherein the frame member is mechanically fixed to the housing member at the protrusion.

17. The display device according to claim 15, wherein the side surface of the display member is provided with a sealing member.

18. The display device according to claim 17, wherein the sealing member is provided in non-contact with the housing member.

19. The display device according to claim 17, wherein the sealing member contains an organic resin having curability.

20. The display device according to claim 19, wherein
a cover glass is further provided on the display surface of the display member, and
the sealing member is provided in a space sandwiched by the cover glass provided to protrude from the display member in an in-plane direction of the display member and the frame member.

* * * * *